US010032963B2

(12) United States Patent
Park et al.

(10) Patent No.: US 10,032,963 B2
(45) Date of Patent: Jul. 24, 2018

(54) LIGHT EMITTING DIODE PACKAGE MODULE AND DISPLAY DEVICE HAVING THE SAME

(71) Applicant: LG DISPLAY CO., LTD., Seoul (KR)

(72) Inventors: Kiduck Park, Paju-si (KR); Jongwan Park, Goyang-si (KR); Donghyun Chung, Seoul (KR); Junsoo Park, Gunpo-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/480,094

(22) Filed: Apr. 5, 2017

(65) Prior Publication Data

US 2017/0317243 A1 Nov. 2, 2017

(30) Foreign Application Priority Data

Apr. 29, 2016 (KR) ........................ 10-2016-0053479

(51) Int. Cl.
*H01L 33/00* (2010.01)
*H01L 33/48* (2010.01)
*H01L 25/075* (2006.01)
*H01L 33/56* (2010.01)
*H01L 33/60* (2010.01)

(52) U.S. Cl.
CPC ........ *H01L 33/486* (2013.01); *H01L 25/0753* (2013.01); *H01L 33/56* (2013.01); *H01L 33/60* (2013.01)

(58) Field of Classification Search
USPC ....................................................... 257/100
See application file for complete search history.

(56) References Cited

U.S. PATENT DOCUMENTS

| 6,930,332 | B2 * | 8/2005 | Hashimoto | ........... H01L 33/642 257/100 |
| 7,960,819 | B2 * | 6/2011 | Loh | ...................... H01L 33/642 257/676 |
| 8,235,551 | B2 * | 8/2012 | Lin | ......................... F21K 9/00 257/696 |

FOREIGN PATENT DOCUMENTS

| KR | 10-2011-0075481 A | 7/2011 |
| KR | 10-2013-0017587 A | 2/2013 |
| KR | 10-2014-0026163 A | 3/2014 |
| TW | 200827855 A | 7/2008 |
| TW | 201322509 A1 | 6/2013 |
| TW | 201428397 A | 7/2014 |

\* cited by examiner

*Primary Examiner* — Chandra Chaudhari
(74) *Attorney, Agent, or Firm* — Seed Intellectual Property Law Group LLP

(57) ABSTRACT

Disclosed herein are an LED package module capable of lowering the price of manufacture by simply reducing the number of LED packages without decreasing the luminance, and a display device having the same. To this end, in an LED package module according to an exemplary embodiment of the present disclosure and a display device having the same, a plurality of LED packages is mounted on an LED module substrate in a matrix such that the LED packages are oriented in intersecting directions alternately in each of the longitudinal and lateral directions. Consequently, it is possible to increase price competitiveness by simply reducing the number of LED packages without degrading the display quality.

20 Claims, 15 Drawing Sheets

LIGHT EMITTING DIODE PACKAGE MODULE AND DISPLAY DEVICE HAVING THE SAME

CROSS-REFERENCE TO RELATED APPLICATIONS

This application claims the priority of Korean Patent Application No. 10-2016-0053479 filed on Apr. 29, 2016, in the Korean Intellectual Property Office, the disclosure of which is hereby incorporated by reference in its entirety.

BACKGROUND

Technical Field

The present disclosure relates to an LED package module and a display device having the same.

Description of the Related Art

An LCD device generally comprises a display panel, which includes an array substrate, a color filter substrate, and a liquid-crystal layer interposed between the array substrate and the color filter substrate. When an electric field is applied across the display panel, the orientation of the liquid-crystal molecules in the liquid-crystal layer is changed, such that a difference in transmittance is made.

Such a display panel is not self-luminous, and thus it requires an additional light source to display the difference in transmittance as an image. To this end, a backlight unit serving as the light source is mounted on the back of the display panel.

The light source of such a backlight unit may be selected from a cold cathode fluorescent lamp (CCFL), an external electrode fluorescent lamp, and a light emitting diode (LED).

Among them, an LED is widely used as the light source for display, because it has small size, low power consumption, and high reliability.

Hereinafter, an existing display device will be described with reference to the drawings.

FIG. 1 is a cross-sectional view showing a portion of an existing display device. FIG. 2 is a perspective view of the LED package of FIG. 1. FIG. 3 is a cross-sectional view taken along line III-III' of FIG. 2.

Referring to FIGS. 1 to 3, the existing display device 1 includes a display panel 10, a main supporter 20, optical sheets 30, a bottom cover 40, an LED package module 50 a reflective plate 60, an adhesive member 70, and a top case 80.

The display panel 10 plays a key role in reproducing an image. The display panel 10 includes first and second substrates (not shown) attached together with a predetermined distance therebetween, and a liquid-crystal layer (not shown) interposed between the first and second substrates.

Various lines and pixel electrodes as well as thin-film transistors are disposed on the first substrate. A color filter layer and a black matrix (BM) for displaying RGB primary colors are disposed on the second substrate. In addition, the display panel 10 may further include a data driver (not shown) and a gate driver (not shown) for controlling the elements. The data driver is connected to data lines on the first substrate to supply data signals to the data lines. The gate driver is connected to gate lines on the first substrate to supply scan signals to the gate lines.

The main supporter 20 is disposed under the display panel 10 to support the edges of the display panel 10. To this end, the main supporter 20 may have a rectangular frame shape.

A plurality of optical sheets 30 is seated on the main supporter (20). The plurality of optical sheets 30 may include a diffuser sheet, a prism sheet, etc.

The bottom cover 40 is mounted under the main supporter 20. Both sides of the bottom cover 40 may be bent upward so that it has side surfaces. Accordingly, the side surfaces of the bottom cover 40 may come in contact with the side surfaces of the main supporter 20.

The LED package module 50 is mounted on the bottom cover 40 and disposed under the plurality of optical sheets 30. The LED package module 50 may include an LED module substrate 52 and a plurality of LED packages 54 mounted on the LED module substrate 52 in a matrix. The plurality of LED packages 54 emits light of red (R), green (G) and blue (B) colors toward the display panel 10. By turning on the plurality of LED packages 54 simultaneously, the color may be combined to produce white light.

The LED package 54 includes an LED chip 54b, a mold frame 54c, and an encapsulant 54d.

At least one LED chip 54b is mounted on the substrate 54a. The LED chip 54b may be mounted on the substrate 54a via a bonding wire 54e.

The mold frame 54c accommodates the LED chip 54b. The mold frame 54c is designed to have a predetermined inclination and has a structure in which all four sides are closed.

The encapsulant 54d seals the substrate 54a and the LED chip 54b in the mold frame 54c.

In the existing LED package 54 having the above-described configuration, the LED chip 54b is disposed in the mold frame 54c having the structure in which all four sides are closed. Accordingly, the existing LED package 54 has a narrow beam angle of approximately 120 degrees as the light L exists from the LED chip 54b only in the upward direction.

The reflective plate 60 is disposed on the LED package module 50 and has a through hole 65 via which the LED package module 50 passes. Accordingly, the reflective plate 60 is disposed on the LED module substrate 52, and a part of the LED package 54 protrudes from the reflective plate 60. The reflective plate 60 reflects the scattered light out of the light emitted from the LED package 54 toward the display panel 10 again, thereby increasing the luminance of the light.

The adhesive member 70 is disposed between the main supporter 20 and the display panel 10 to attach the display panel 10 to the main supporter 20. The top case 80 is mounted on the display panel 10 and is coupled with the main supporter 20 and the display panel 10.

FIG. 4 is a view illustrating the arrangement of the existing LED package module, which will be described in conjunction with FIG. 1.

As shown in FIGS. 1 and 4, a plurality of LED packages 54 is mounted on the LED module substrate 52 in a matrix.

The shorter axis of the plurality of LED packages 54 is regularly arranged along the first direction or the second direction.

The first distance d1, which is the spacing between the center axes of the plurality of LED packages 54 arranged in the x-axis direction, is approximately 33 to 35 mm. The second distance d2, which is the spacing between the center axes of the plurality of LED packages 54 in the y-axis direction, is approximately 37 to 39 mm. Accordingly, the first distance d1 is designed to be 90% or less of the second distance d2.

In the above-described existing display device 1, the light exits from the LED chip 54b only in the upward direction so that it has narrow beam angle of approximately 120 degrees, and the plurality of LED packages is mounted in vertically or horizontally regular arrangement, such that it is difficult to reduce the number of the LED packages 54.

FIG. 5 is a cross-sectional view showing a part of another existing display device. FIG. 6 is a view illustrating a beam angle characteristic of the existing LED package.

As shown in FIGS. 5 and 6, the existing display device 1 includes a reflective plate 60 disposed on a bottom cover 40, and a light guide plate 90 disposed on the reflective plate 60. The LED package module 50 is disposed on the side wall of the bottom cover 40 so as to be spaced apart from the light guide plate 90.

The reflective plate 60 is located on the back surface of the light guide plate 90 and reflects light passing through the back surface of the light guide plate 90 toward the display panel 10, thereby improving the brightness of light.

The light guide plate 90 allows the light incident from the plurality of LED packages 50 to evenly spread to the wide area of the light guide plate 90 by total internal reflection while the light propagates in the light guide plate 90, to provide a surface light source to the display panel 10.

The LED package module 50 includes an LED module substrate 52 and a plurality of LED packages 54 mounted on the LED module substrate 52. Two or more columns of LED packages 50 may be mounted on the LED module substrate 52.

As shown in FIG. 6, the existing LED package 54 has narrow beam angle characteristics (i.e., light exits only in the upward direction), and thus overlapping areas of light exiting from adjacent LED packages 354 is distant. Therefore, the shielding area F of the light-incident portion of the LED packages 354 is increased.

As a result, in the existing display device 1, it is difficult to reduce the light-incident bezel area BA with the plurality of LED packages 54 having the narrow beam angle characteristics.

In the related art, Korean Patent Laid-Open Publication No. 10-2014-0026163 published on Mar. 5, 2014 discloses a method for manufacturing a semiconductor device structure.

SUMMARY

It is an object of the present disclosure to provide an LED package module capable of lowering the price by simply reducing the number of LED packages without decreasing the luminance, and a display device having the same.

To this end, in an LED package module according to an exemplary embodiment of the present disclosure and a display device having the same, a plurality of LED packages is mounted on an LED module substrate in a matrix such that the LED packages are oriented in the intersecting directions alternately in each of the longitudinal and lateral directions.

As a result, a plurality of LED packages having wide beam angle characteristics (i.e., light exits via two side surfaces as well as the upward direction) is mounted on the substrate such that they are oriented in the intersecting directions in the longitudinal and lateral directions, thereby increasing emission efficiency in the lateral direction. In this manner, it is possible to reduce the number of the LED packages without decreasing the luminance.

Consequently, it is possible to increase price competitiveness by simply reducing the number of LED packages without degrading the display quality.

In addition, it is another object of the present disclosure to provide an LED package module capable of implementing a narrow bezel while overcoming light bouncing defect at a light-incident portion due to the narrow bezel, and a display device having the same.

To this end, an LED package module according to an exemplary embodiment of the present disclosure and a display device having the same employs a milky buffer pad having optimal conditions for absorption and reflection, along with an LED package having wide beam angle of 125 to 130 degrees.

In accordance with one aspect of the present disclosure, an LED package module and a display device having the same includes a plurality of LED packages having open surfaces exposed via side surfaces parallel with the shorter axis cut by mold dicing.

In addition, in an LED package module according to an exemplary embodiment of the present disclosure and a display device having the same, first LED packages mounted with open side surfaces aligned in a first direction and second LED packages mounted with open side surfaces aligned in a second direction intersecting the first direction are arranged in a matrix such that they are oriented in intersecting directions alternately in column and row directions.

Accordingly, the plurality of first LED packages and the plurality of the second LED packages oriented in the intersecting directions alternately have the wide beam angle characteristic of 125 to 130 degrees, and thus the emission efficiency in the lateral direction where the open surfaces are formed can be increased. As a result, a first distance between the center axis of the first LED packages and the center axis of the second LED packages arranged in the column direction, and a second distance between the center axis of the first LED packages and the center axis of the second LED packages arranged in the row direction can be widened.

Accordingly, the plurality of LED packages having wide beam angle characteristics (i.e., light exits via two side surfaces as well as the upward direction) is mounted on the substrate such that they are oriented in the intersecting directions in the longitudinal and lateral directions, thereby increasing emission efficiency in the lateral direction. In this manner, it is possible to widen the distance between the LED packages without decreasing the luminance. As the distance is widened, the number of the LED packages can be reduced.

Consequently, it is possible to increase price competitiveness by simply reducing the number of LED packages without degrading the display quality.

According to an exemplary embodiment of the present disclosure, a plurality of LED packages having wide beam angle characteristics (i.e., light exits via two side surfaces as well as the upward direction) is mounted on the substrate such that they are oriented in the intersecting directions in the longitudinal and lateral directions, thereby increasing emission efficiency in the lateral direction. In this manner, it is possible to reduce the number of the LED packages without decreasing the luminance.

Consequently, it is possible to increase price competitiveness by simply reducing the number of LED packages without degrading the display quality.

According to an exemplary embodiment of the present disclosure, the display device employs the milky buffer pad having optimal conditions for absorption and reflection, and the LED package having the wide beam angle characteristics of 125 to 130 degrees, and thus it is possible to implement the narrow bezel and to overcome the light bouncing at the light-incident portion due to the narrow bezel.

DETAILED DESCRIPTION

Figure 1:
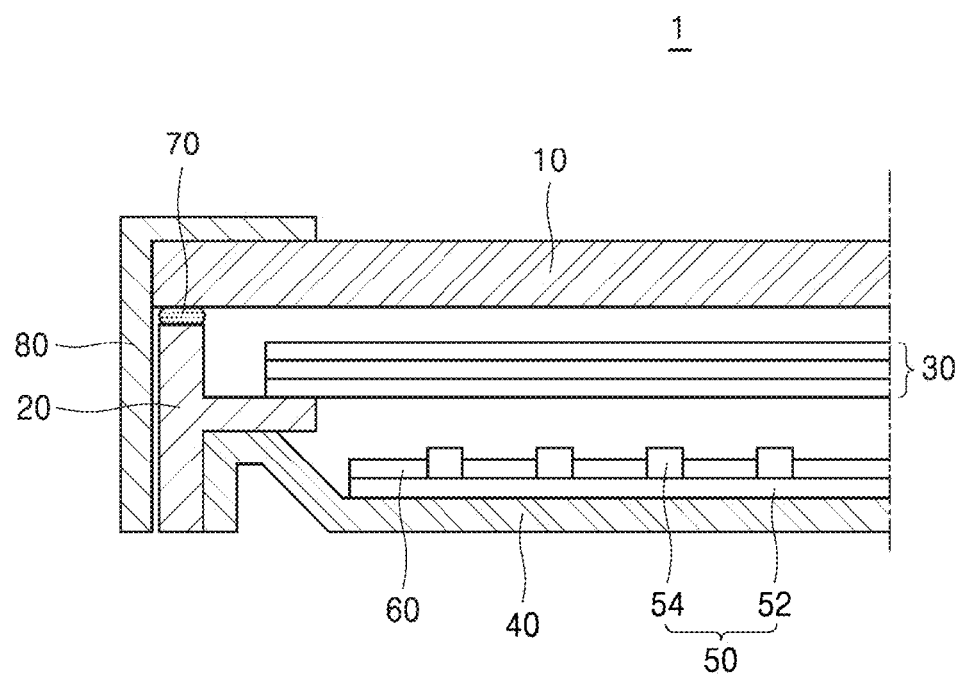
FIG. 1 is a cross-sectional view showing a portion of an existing display device.
Figure 2:
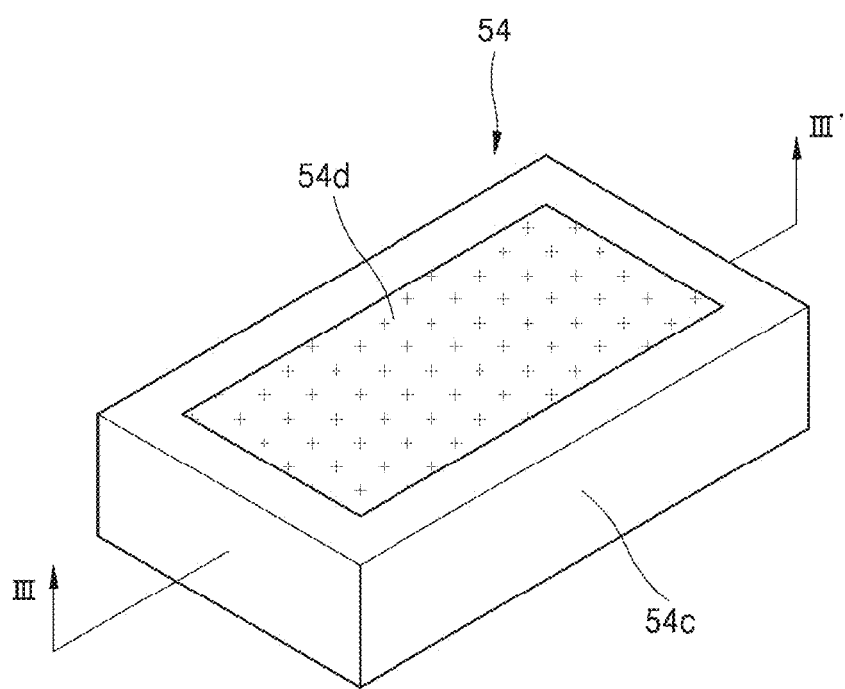
FIG. 2 is a perspective view of the LED package of FIG. 1.
Figure 3:
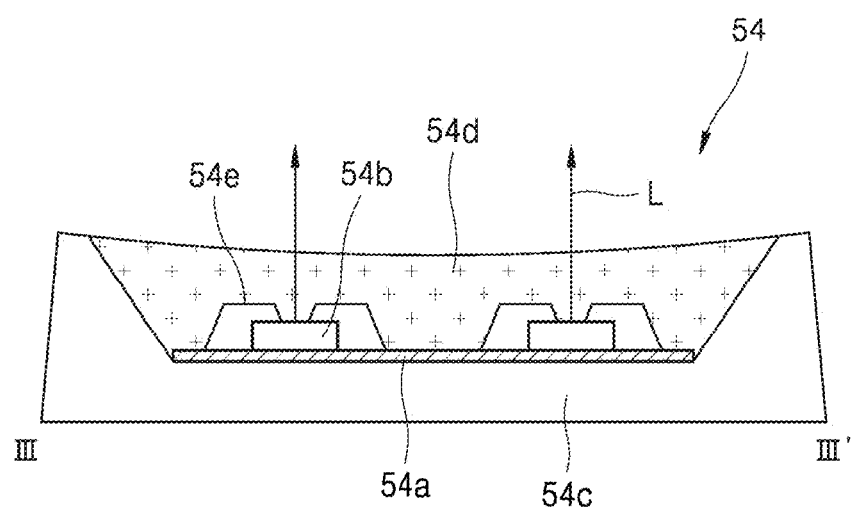
FIG. 3 is a cross-sectional view taken along line III-III' of FIG. 2.
Figure 4:
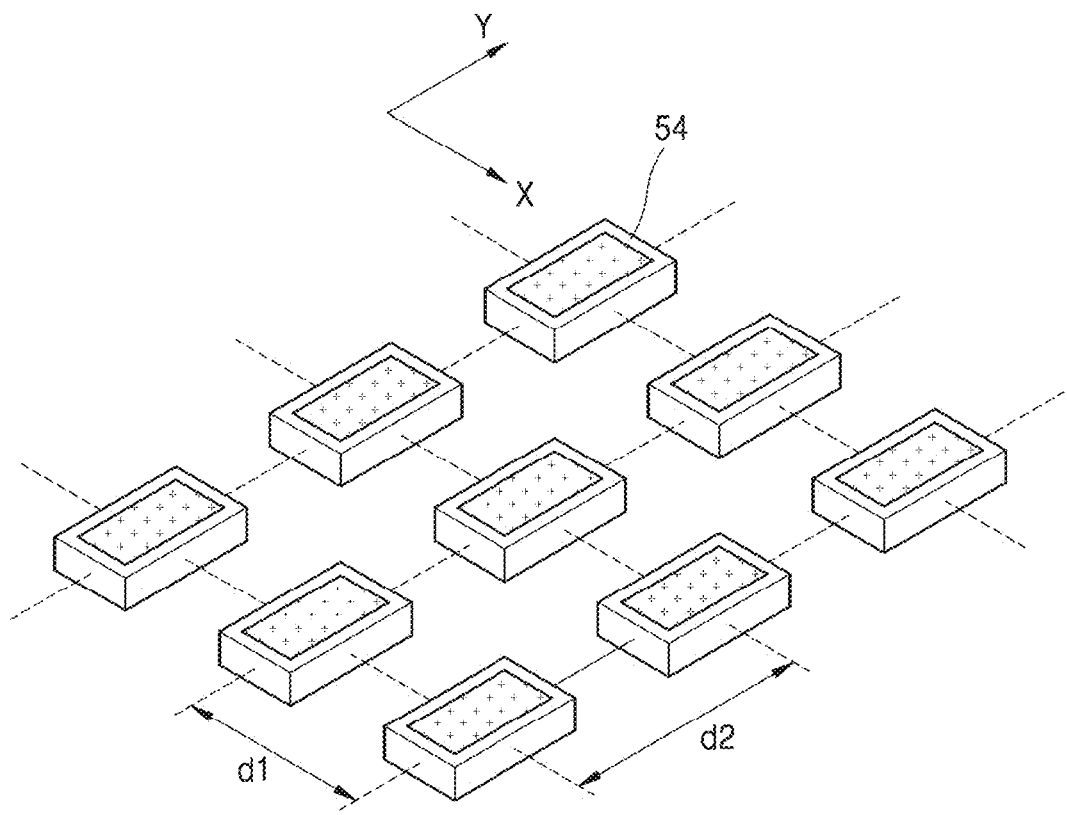
FIG. 4 is a view illustrating the arrangement of the existing LED package module.

The above objects, features and advantages will become apparent from the detailed description with reference to the accompanying drawings. Embodiments are described in sufficient detail to enable those skilled in the art in the art to easily practice the technical idea of the present disclosure. Detailed descriptions of well known functions or configurations may be omitted in order not to unnecessarily obscure the gist of the present disclosure. Hereinafter, embodiments of the present disclosure will be described in detail with reference to the accompanying drawings. Throughout the drawings, like reference numerals refer to like elements.

Hereinafter, an LED package module according to exemplary embodiments of the present disclosure and a display device having the same will be described in detail with reference to the accompanying drawings.

Figure 7:
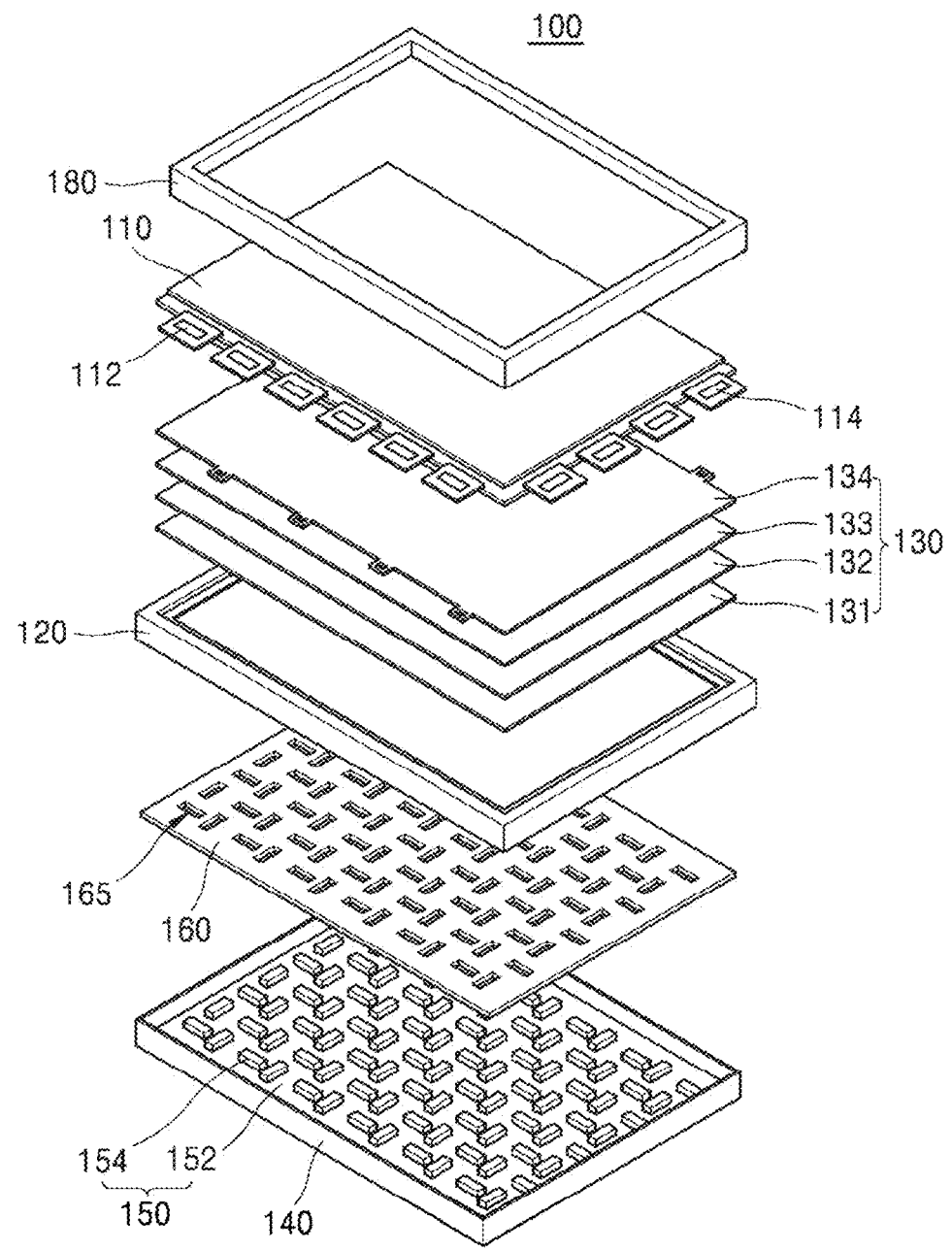
FIG. 7 is an exploded perspective view of a display device according to a first embodiment of the present disclosure.

FIG. 7 is an exploded perspective view of a display device according to a first embodiment of the present disclosure.

Referring to FIG. 7, the display device 100 according to the first embodiment of the present disclosure includes a display panel 110, a main supporter 120, optical sheets 130, a bottom cover 140, an LED package module 150, a reflective plate 160, and a top case 180.

The display panel 110 plays a key role in reproducing an image. Although not specifically shown in the drawings, the display panel 110 includes first and second substrates (not shown) attached together with a predetermined distance therebetween, and a liquid-crystal layer (not shown) interposed between the first and second substrates.

Various lines and pixel electrodes as well as thin-film transistors are disposed on the first substrate. A color filter layer and a black matrix (BM) for displaying RGB primary colors are disposed on the second substrate.

In addition, the display panel 110 may further include a data driver 112 and a gate driver 114 for controlling the elements. The data driver 114 is connected to data lines on the first substrate to supply data signals to the data lines. The gate driver 114 is connected to gate lines on the first substrate to supply scan signals to the gate lines.

The main supporter 120 is disposed under the display panel 110 to support the edge of the display panel 110. To this end, the main supporter 120 may have a rectangular frame shape.

A plurality of optical sheets 130 is seated on the main supporter 120. The plurality of optical sheets 130 refract or scatter light incident from the LED package module 150 to widen the view angle and increase the brightness of the display device 100.

Specifically, the plurality of optical sheets 130 may include at least two of a diffuser sheet 131, a prism sheet 132, a protection sheet 133, and a double brightness enhancement film (DBEF) 134. FIG. 7 shows an example of the plurality of optical sheets 130 that has a four-layer structure in which the diffuser sheet 131, the prism sheet 132, the protection sheet 133, and the DBEF 134 are sequentially stacked on one another.

The diffuser sheet 131 diffuses the light exiting from the LED package module 150 along the surface to make the color and brightness of the entire screen of the display device 100 uniform.

The prism sheet 132 serves to refract or condense the light diffused by the diffuser sheet 131 to increase the brightness.

The protection sheet 133 protects the diffuser sheet 131 and the prism sheet 132 from external impacts or foreign matter. In addition, the protection sheet 133 is mounted for the purpose of preventing scratches on the prism sheet 132.

The DBEF 134 is mounted for the purpose of improving the luminance. The DBEF 134 is a type of polarizing film and is referred to as a reflective polarizing film. When the light exits from the LED package module 150, the DBEF 134 transmits the polarized light in a direction parallel to the polarization direction of the DBEF 134 and reflects the polarized light in a direction different from the polarization direction of the DBEF 134, to thereby improve the luminance.

The bottom cover 140 is mounted under the main supporter 120. Both sides (or all four sides, as shown) of the bottom cover 140 may be bent upward so that it has side surfaces. Accordingly, the side surfaces of the cover bottom 140 may come in contact with the side surfaces of the main supporter 120.

The LED package module 150 is mounted on the cover bottom 140 and disposed under the plurality of optical sheets 130.

The LED package module 150 includes an LED module substrate 152 and a plurality of LED packages 154 mounted in a matrix on the LED module substrate 152. The plurality of LED packages 154 emits light of red (R), green (G) and blue (B) colors toward the display panel 110. By turning on the plurality of LED packages 154 simultaneously, the color may be combined to produce white light.

In the direct-type display device 100 shown in FIG. 7, lights exiting from adjacent LED packages 154 are overlapped and mixed with each other, and then directly incident on the display panel 110 to provide a surface light source. To display a more vivid image, the direct-type display device 100 may sequentially turn the plurality of LED packages 154 on/off to supply light part by part to the display panel 110 (local dimming). By doing so, a bright image can be brighter and a dark image can be darker, such that the contrast ratio can be improved and a more vivid image can be produced.

In particular, the plurality of LED packages 154 is arranged in a matrix on the LED module substrate 152, such that the LED packages 154 are oriented in intersecting directions alternately in each of the lateral direction and the longitudinal direction. By mounting the plurality of LED packages 154 in this manner, it is possible to reduce the number of the LED packages 154 to thereby reduce the cost. This will be described in more detail below.

The reflective plate 160 is disposed on the LED package module 150 and has a plurality of through holes 165 via which the LED package module 150 passes. Specifically, the reflective plate 160 is disposed on the LED module substrate 152, and a part of the LED package 154 protrudes from the reflective plate 160. The reflective plate 160 reflects the scattered light out of the light emitted from the LED package 154 toward the display panel 110 again, thereby increasing the brightness of the light.

The top case 180 is mounted on the display panel 110 and is coupled with the main supporter 120 and the display panel 110.

In the display device 100 according to the first embodiment of the present disclosure, the plurality of LED packages 154 is mounted on the LED module substrate 152 in the matrix such that the LED packages 154 are oriented in the intersecting directions alternately in each of the longitudinal and lateral directions, thereby reducing the number of the LED packages 154.

This will be described in more detail with reference to the accompanying drawings.

Figure 8:
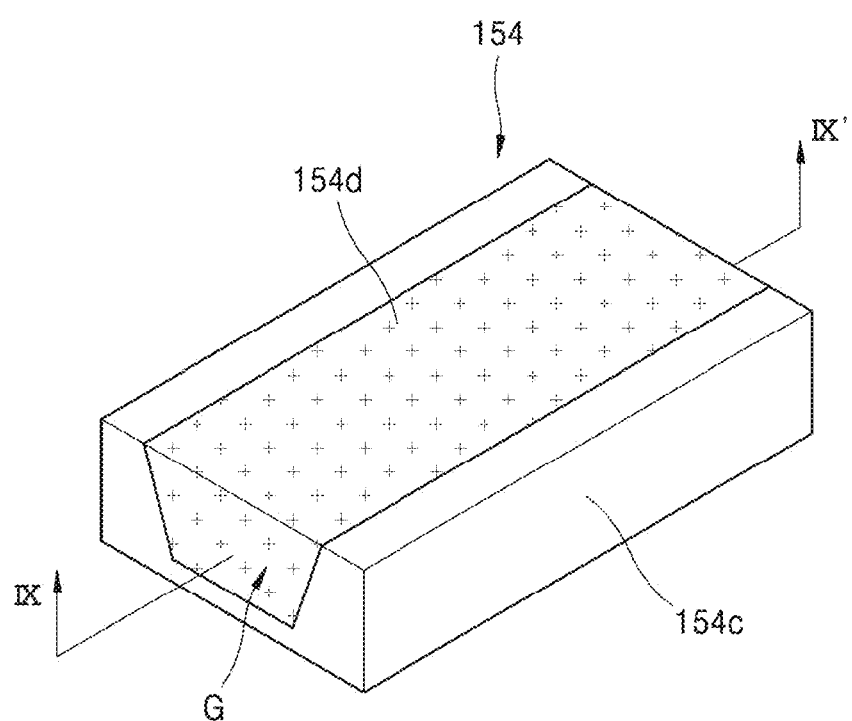
FIG. 8 is a perspective view of an LED package of FIG. 7.
Figure 9:
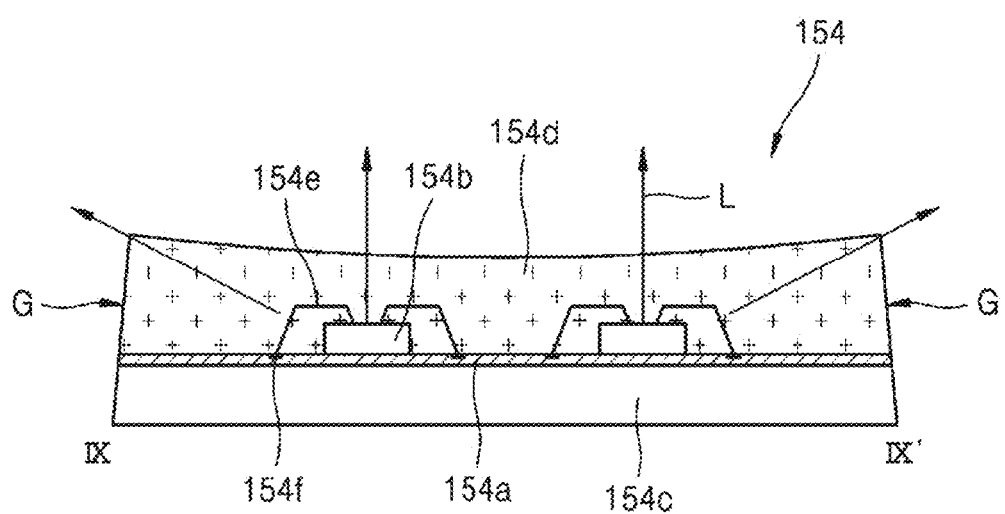
FIG. 9 is a cross-sectional view taken along line IX-IX' of FIG. 8.

FIG. 8 is a perspective view of an LED package of FIG. 7. FIG. 9 is a cross-sectional view taken along line IX-IX' of FIG. 8.

As shown in FIGS. 8 and 9, the LED package 154 includes an LED chip 154b, a mold frame 154c, and an encapsulant 154d. The encapsulant is generally transparent to the light that is output by the LED.

At least one LED chip 154b is mounted on the substrate 154a. Any known substrate may be used as the substrate 154a as long as it can mount the LED chip 154b thereon at a high density with the proper electrical connections to the bonding wires 154e and isolation between these bonding wires. One acceptable example for the substrate 154a is a lead frame of a type known in the art for LEDs. The LED chip 154b may be mounted on the substrate 154a. A bonding wire 154e electrically couples the LED chip 154b to one or more conductive pads 154f on the substrate 154a.

The material of the substrate 154a may be comprised of alumina, quartz, calcium zirconate, forsterite, silicon carbide (SiC), graphite, zirconia, plastic, metal, etc. The substrate provides electrical connection for the bonding wires 154e and permits a separate voltage to be provided to each, the details of which are not shown since such structure is well known in the art.

The mold frame 154c supports the LED chip 154b and has two closed side surfaces parallel with the longer axis. Namely the closed side surfaces include opaque walls that are continuous between upper and lower surfaces of the mold frame 154c, and thus block any light from the LED exiting from the closed side surfaces, as shown in FIG. 8. The opaque walls extend along the entire length of the mold frame 154c along the longer axis. The mold frame also has two open side surfaces parallel with the shorter axis. Namely, the open side surfaces have a region in which the encapsulant is exposed and is thus transparent to the light output by the LED. It has at least one open portion, between the upper and lower surfaces of the mold frame 154c, as shown in FIG. 8. This open side surface can be achieved by mold dicing. That is, two side surfaces in parallel with the shorter axis of the mold frame 154c are removed by mold dicing, such that a part of the transparent encapsulant 154d inside the mold frame 154c is exposed to the outside.

The encapsulant 154d seals the substrate 154a and the LED chip 154b in the mold frame 154c and has open surfaces G exposed to the outside via the open side surfaces of the mold frame 154c. The encapsulant 154d may be a pure silicone resin, a silicone resin mixed with a dispersing agent, etc. The encapsulant 154d may be one selected from the group consisting of a gel-like silicone resin, a silicone resin mixed with a dispersing agent, a silicone resin mixed with a phosphor, etc.

As described above, the LED package 154 has the open surfaces G exposed via the side surfaces parallel with the shorter axis cut by mold dicing. Accordingly, the plurality of LED packages 154 has a structure in which light exits via the side surfaces where the opening surfaces G are formed as well as the upward direction. Therefore, the angle by which light exits from the plurality of LED packages 154 is increased, such that a wide beam angle of 125 to 130 degrees is obtained.

Figure 10:
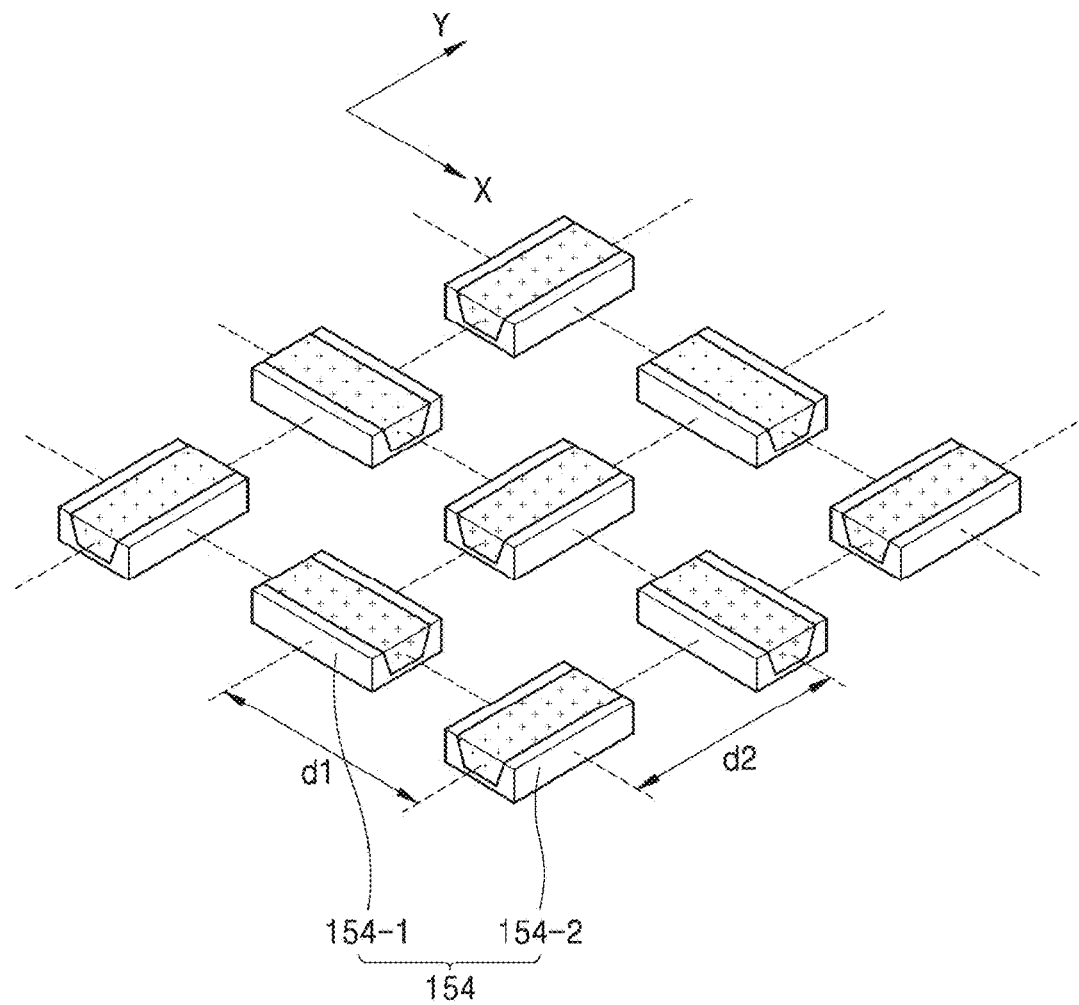
FIG. 10 is a diagram showing an arrangement of LED packages according to the first embodiment of the present disclosure.

FIG. 10 is a view showing an arrangement of the LED packages according to the first embodiment of the present disclosure, which will be described in conjunction with FIGS. 7 and 8.

As shown in FIGS. 7, 8 and 10, the plurality of LED packages 154 are mounted on the LED module substrate 52 in a matrix.

The plurality of LED packages 154 includes first LED packages 154-1 mounted with the open surfaces G aligned in the first direction which is the x-axis direction (i.e., the long axis, which passes through the open surfaces G, of each of the first LED packages 154-1 is aligned in the x-axis direction), and second LED packages 154-2 mounted with the open surfaces G aligned in the second direction, which is the y-axis direction intersecting the first direction (i.e., the short axis, which is transverse with respect to the long axis, of each of the second LED packages 154-2 is aligned in the y-axis direction).

In particular, the first and second LED packages 154-1 and 154-2 are arranged in a matrix and are arranged alternately along the column and row directions. Accordingly, the first LED packages 154-1 and the second LED packages 154-2 are arranged alternately in each of the column direction and the row direction such that they are oriented in the intersecting directions repeatedly.

In the column direction (e.g., the x-axis direction), the distance between the central axis of a first LED package 154-1 and the central axis of a second LED package 154-2 is a first distance d1. In the row direction (e.g., the y-axis direction), the distance between the central axis of a first LED package 154-1 and the center axis of a second LED package 154-2 is a second distance d2.

The first distance d1 may be equal to or similar to the second distance d2, because the plurality of LED packages 154 has the wide beam angle characteristics (i.e., light exits via the two side surfaces as well as the upward direction), and the first LED packages 154-1 and the second LED packages 154-2 are oriented in the intersecting directions (i.e., with respective long axes intersecting one another) alternately in each of the column and row directions.

This will be described in more detail. Since the plurality of first LED packages 154-1 and the plurality of the second LED packages 154-2 are oriented in the intersecting directions alternately in the LED packages 154 according to the exemplary embodiment of the present disclosure, they have the wide beam angle characteristic of 125 to 130 degrees, and thus the emission efficiency in the lateral direction where the open surfaces are formed is increased. As a result, the first distance d1 between the central axis of first LED packages 154-1 and the central axis of second LED packages 154-2 in the column direction and the second distance d2 between the central axis of the first LED packages 154-1 and the center axis of the second LED packages 154-2 can be widened.

Accordingly, the first distance d1 may have a length of 37 to 42 mm, and the second distance d2 may have a length of 38 to 42 mm. However, the lengths are not limited to the above numerical values.

Accordingly, according to the first embodiment of the present disclosure, in the display device 100, the plurality of LED packages having the wide beam angle characteristics (i.e., light exits via the two side surfaces as well as the upward direction) is mounted on the substrate in the intersecting direction in the longitudinal and lateral directions, thereby increasing emission efficiency in the lateral direction. In this manner, it is possible to widen the distance between the LED packages without decreasing the luminance. As the distance is widened, the number of the LED packages 154 can be reduced.

As a result, the display device 100 according to the first embodiment of the present disclosure can increase price competitiveness by simply reducing the number of LED packages 154 without degrading the display quality.

For a screen size of 75 inches, the existing display device 1 shown in FIG. 1 has a luminance of 3,000 nit when 1,152 LED packages 54 are mounted thereon. In contrast, the display device 100 according to the first embodiment of the present disclosure exhibits a luminance of 3,000 nit with only 1,056 LED packages 154 mounted thereon.

Figure 11:
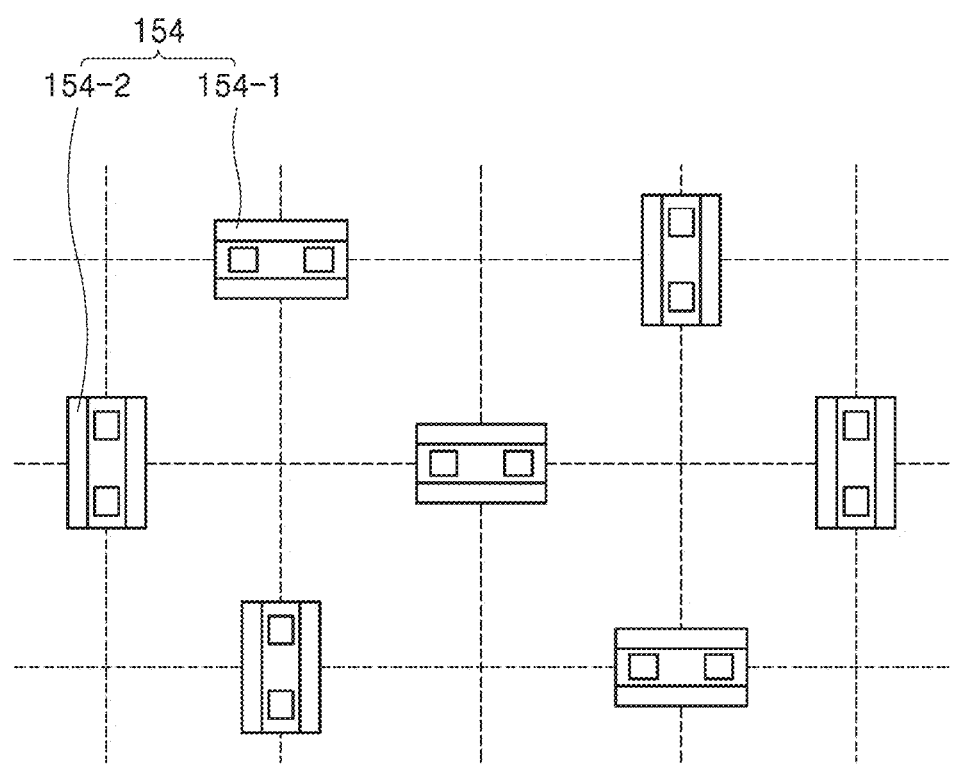
FIG. 11 is a diagram showing an arrangement of LED packages according to a modification of the first embodiment of the present disclosure

FIG. 11 is a diagram showing an arrangement of LED packages according to a modification of the first embodiment of the present disclosure.

As shown in FIG. 11, the plurality of LED packages 154 may be mounted on the LED module substrate 152 shown in FIG. 7 in a diamond-like pattern such that they are oriented in the intersecting directions alternately. The diamond-like pattern includes a plurality of diamond shapes, with each such diamond shape including four LED packages 154. Among the four LED packages 154 in each diamond shape, two are first LED packages 154-1 that are arranged with the open surfaces aligned in a first direction, and two are second LED packages 154-2 that are arranged with the open surfaces aligned in a second direction.

When the plurality of LED packages 154 having the wide beam angle characteristic (i.e., light exits in the upward direction and the lateral direction) are arranged in the diamond shape, the number of the LED packages 154 can be reduced without decreasing the luminance by increasing the emission efficiency in the lateral direction, as achieved by the first embodiment.

As a result, the display device 100 according to the modification of the first embodiment of the present disclosure can increase price competitiveness by simply reducing the number of LED packages 154 without degrading the display quality.

Figure 12:
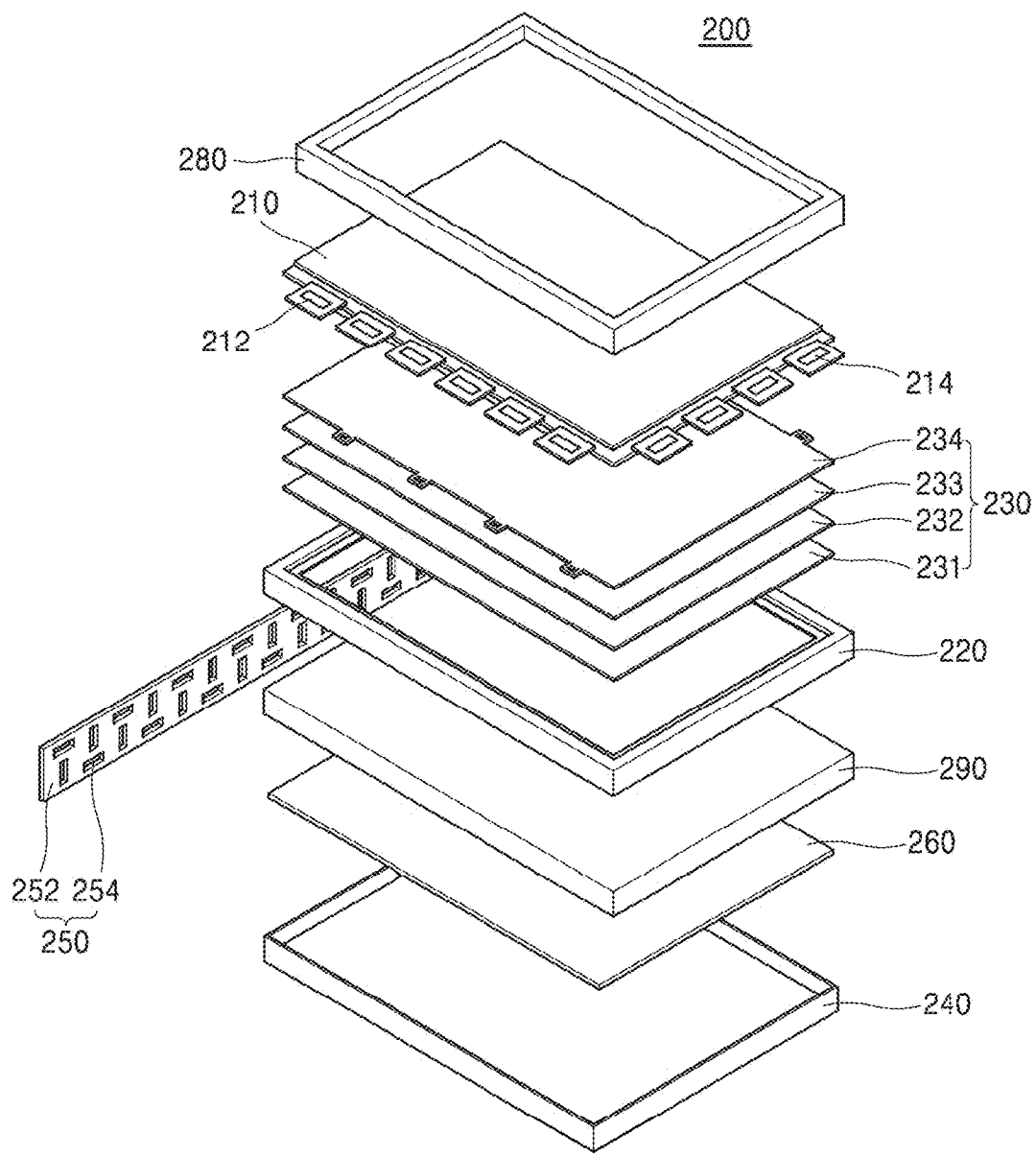
FIG. 12 is an exploded perspective view of a display device according to a second embodiment of the present disclosure.

FIG. 12 is an exploded perspective view of a display device according to a second embodiment of the present disclosure. The display device according to the second embodiment of the present disclosure is substantially the same as the display device according to the first embodiment except that the LED package module is of an edge type that is mounted on a sidewall of a bottom cover; and, therefore, the redundant description will be omitted.

As shown in FIG. 12, in the display device 200 according to the second embodiment of the present disclosure, a reflective plate 260 is disposed on a bottom cover 240, a light guide plate 290 is disposed on the reflective plate 260, and an LED package module 250 is disposed on the side wall of the bottom cover 240 with a spacing from the light guide plate 290.

The reflective plate 260 is located on the back surface of the light guide plate 290 and reflects light passing through the back surface of the light guide plate 290 toward the display panel 210, thereby improving the brightness of light.

The light guide plate 290 allows the light incident from the plurality of LED packages 254 to evenly spread to the wide area of the light guide plate 290 by total internal reflection while the light propagates in the light guide plate 290, to provide a surface light source to the display panel 210. The light guide plate 290 may have a particular pattern on the back surface to provide a uniform surface light source. The particular pattern may be designed in various forms such as an elliptical pattern, a polygonal pattern, and a hologram pattern in order to guide light incident into the light guide plate 290. The pattern may be formed on the back surface of the light guide plate 290 by printing, injecting and so on.

Although the LED package module 250 is shown as being mounted on one of the shorter sides of the main supporter 220, this is merely illustrative. For example, the LED package module 250 may be mounted on either of the shorter sides of the main supporter 220. In addition, the LED package module 250 may be mounted on only one of the longer sides of the main supporter 220 or on either of the longer sides of the main supporter 220.

The LED package module 250 includes an LED module substrate 252 and a plurality of LED packages 254 mounted on the LED module substrate 252. Two or more columns of LED packages 254 may be mounted on the LED module substrate 252 in a matrix such that they are oriented in the intersecting directions alternately. The plurality of LED packages 254 may be substantially the same as the LED packages described above with reference to FIGS. 7 to 9.

Like the first embodiment, according to the second embodiment of the present disclosure, in the display device 200, the plurality of LED packages having the wide beam angle characteristics (i.e., light exits via the two side surfaces as well as the upward direction) is mounted on the substrate in the intersecting direction in the longitudinal and lateral directions, thereby increasing emission efficiency in the lateral direction. In this manner, it is possible to widen the distance between the LED packages 254 without decreasing the luminance. As the distance is widened, the number of the LED packages 254 can be reduced.

As a result, the display device 200 according to the first embodiment of the present disclosure can increase price competitiveness by simply reducing the number of LED packages 254 without degrading the display quality.

Figure 13:
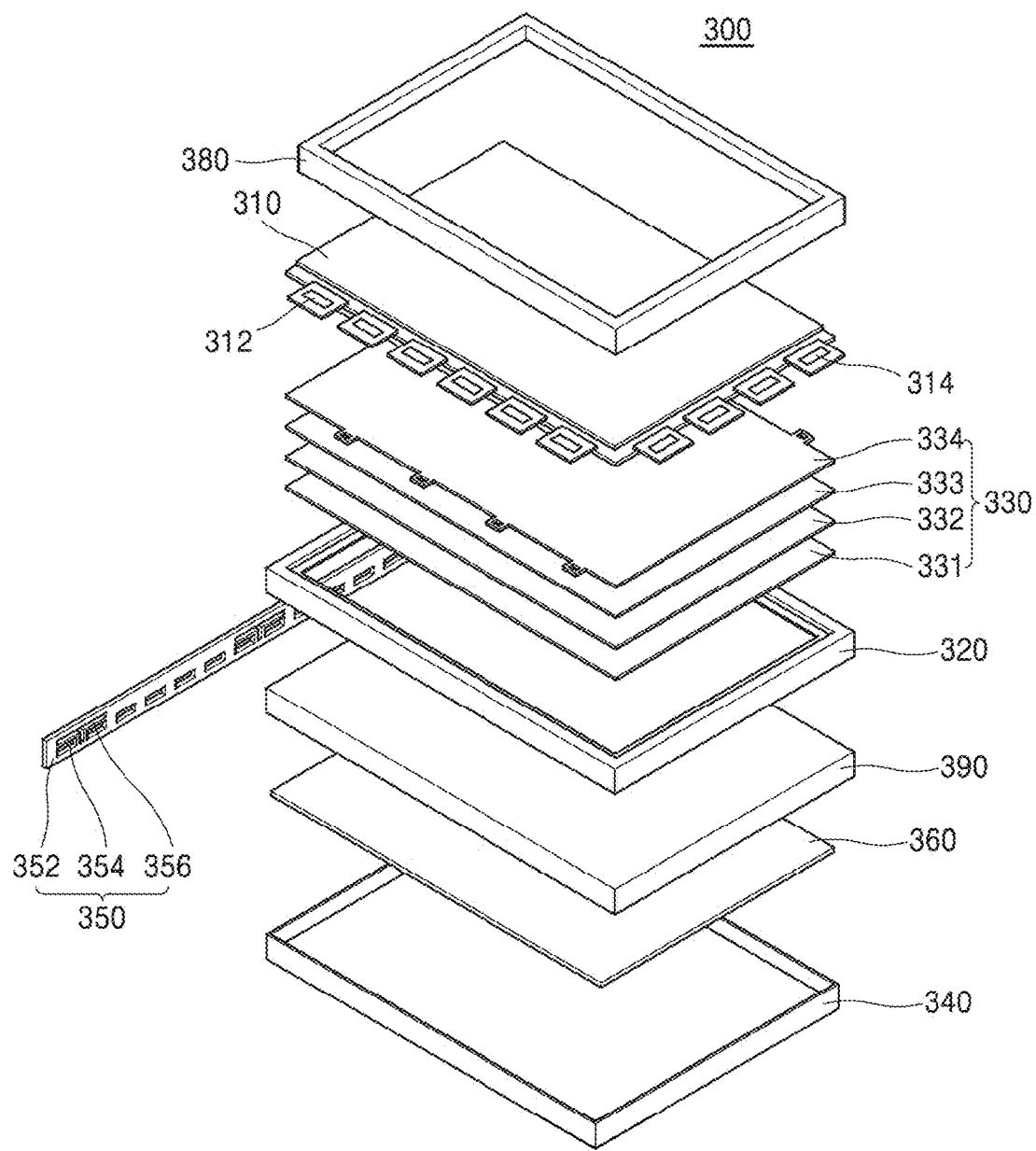
FIG. 13 is an exploded perspective view of a display device according to a third embodiment of the present disclosure.
Figure 14:
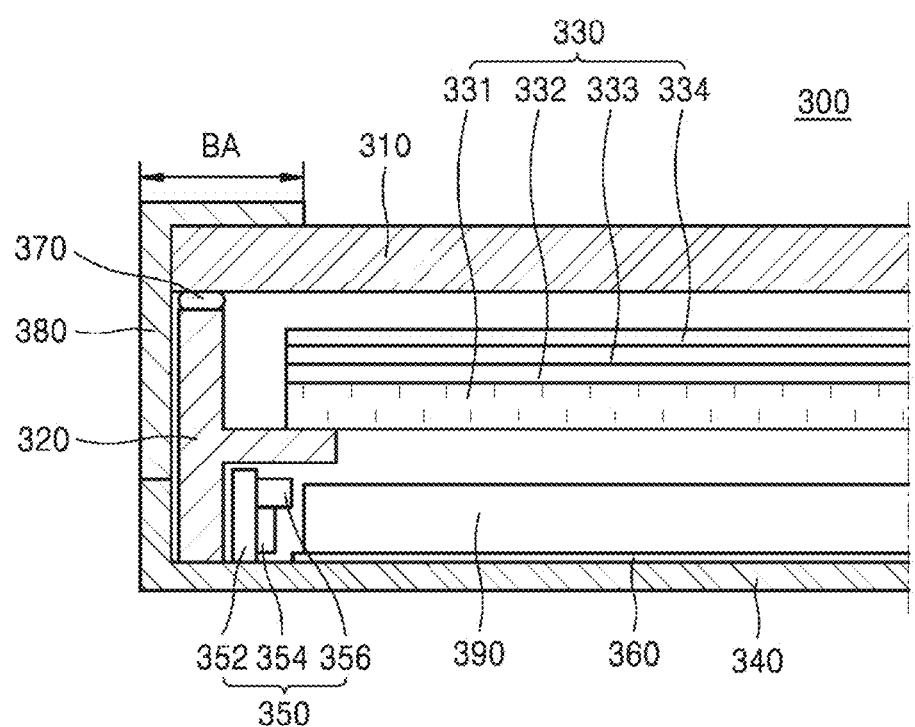
FIG. 14 is a cross-sectional view showing a portion of the display device according to the third embodiment of the present disclosure.
Figure 15:
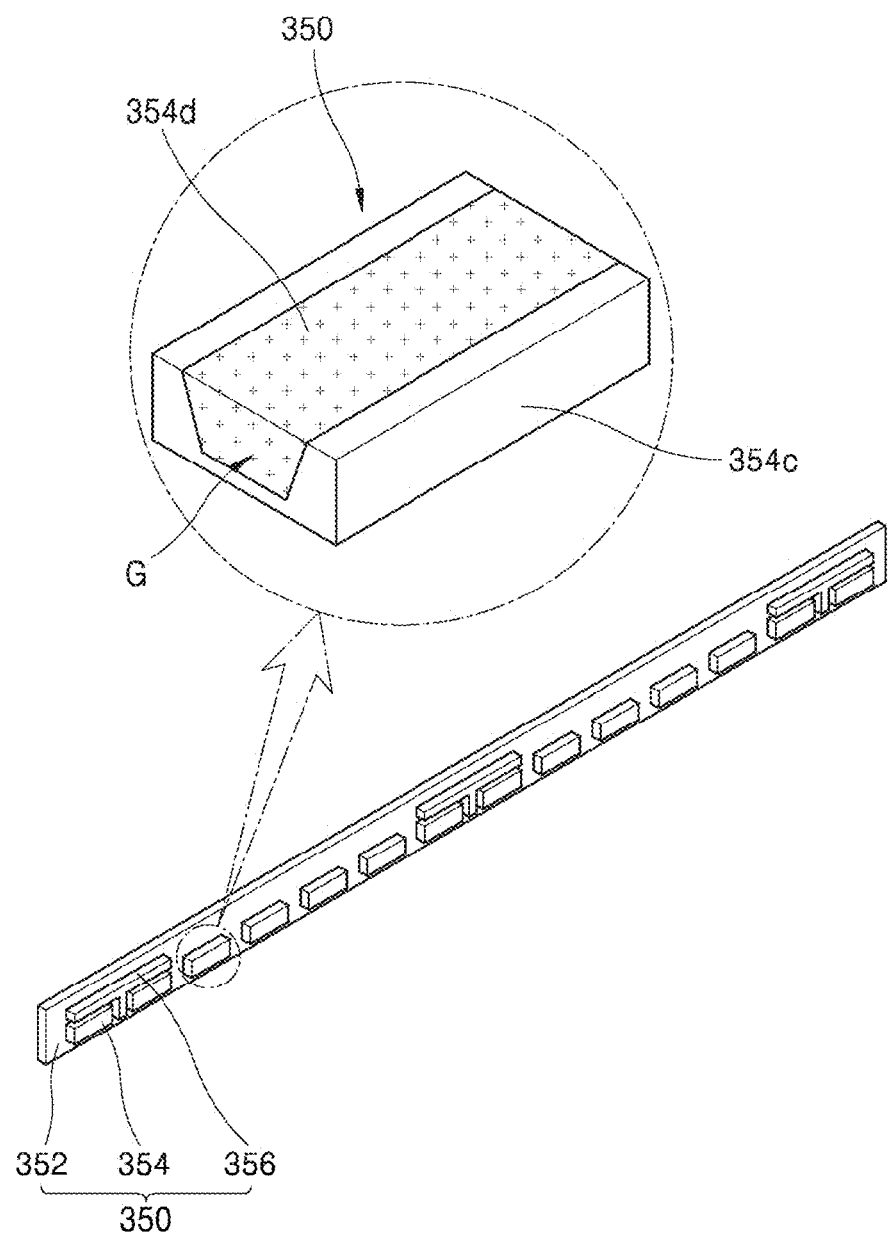
FIG. 15 is an enlarged perspective view of the LED package module of FIG. 13.

FIG. 13 is an exploded perspective view of a display device according to a third embodiment of the present disclosure. FIG. 14 is a cross-sectional view showing a portion of the display device according to the third embodiment of the present disclosure. FIG. 15 is an enlarged perspective view of the LED package module of FIG. 13. The display device according to the third embodiment of the present disclosure is substantially the same as the display device according to the first embodiment except that the LED package module has different configuration; and, therefore, the redundant description will be omitted.

Referring to FIGS. 13 to 15, the display device 300 according to the third embodiment of the present disclosure may further include an adhesive member 370. The adhesive member 370 is disposed between the main supporter 320 and the display panel 310 to attach the display panel 310 to the main supporter 320.

In particular, the LED package module 350 of the display device 300 according to the third embodiment of the present disclosure is mounted on at least one edge of the bottom cover 340. Accordingly, the LED package module 350 is disposed on or adjacent to a sidewall of the bottom cover 340 and is spaced apart from the light guide plate 390 by a predetermined distance.

The LED package module 350 includes an LED module substrate 352, a plurality of LED packages 354, and a buffer pad 356.

Each of the plurality of LED packages 354 mounted on the LED module substrate 352 has open surfaces G exposed via the side surfaces parallel with the shorter axis cut by mold dicing. Accordingly, the plurality of LED packages 354 has a structure in which light exits via the side surfaces where the opening surfaces G are formed as well as the upward direction. Therefore, the angle by which light exits from the plurality of LED packages 354 is increased, such that the wide beam angle of 125 to 130 degrees is obtained.

Although not specifically shown in the drawings, the plurality of LED packages 354 includes, as in the second embodiment, first LED packages mounted with the open surfaces G aligned in the first direction, and second LED packages mounted with the open surfaces G aligned in the second direction intersecting the first direction.

At least one buffer pad 356 is mounted in a space between the LED packages 354 to prevent the plurality of LED packages 354 from coming into contact with the light guide plate 390. The buffer pad 356 may be designed in a T-shape, so it is also named as a T-pad.

In the display device 300 according to the third embodiment of the present disclosure, the LED packages 354 are disposed in as close contact with the light guide plate 390 as possible in order to implement a narrow bezel. However, the LED packages 354 may be damaged when the light guide plate 390 floats due to an external impact or thermal expansion. To prevent this, the buffer pad 356 is designed to prevent the LED packages 354 from being damaged. Therefore, it is desirable that the buffer pad 356 is designed to be thicker than the plurality of LED packages 354 when viewed in section (e.g., the buffer pad 356 extends from the LED module substrate 352 toward the light guide plate 390 to a position beyond the LED packages 354, as shown in FIG. 14).

Figure 16:
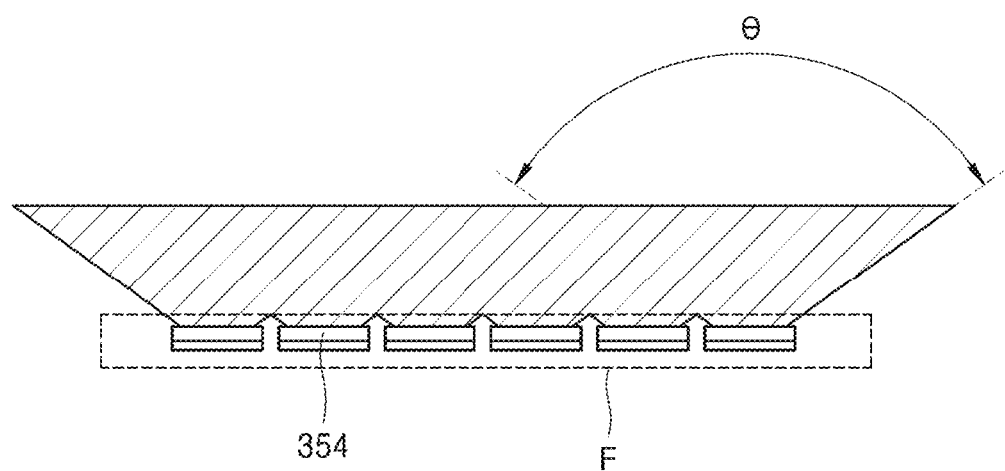
FIG. 16 is a view illustrating beam angle characteristics of an LED package according to an exemplary embodiment of the present disclosure.
Figure 17:
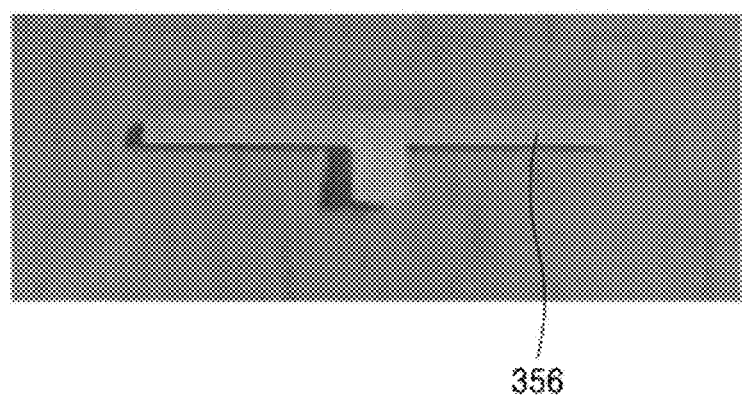
FIG. 17 is a picture of the buffer pad of FIG. 13.

FIG. 16 is a view illustrating beam angle characteristics of an LED package according to an exemplary embodiment of the present disclosure. FIG. 17 is a picture of the buffer pad of FIG. 13, which will be described in conjunction with FIG. 13.

As shown in FIGS. 13, 16 and 17, the plurality of LED packages 354 according to this exemplary embodiment has a wide beam angle characteristic (i.e., light exits in the upward direction and the lateral direction), as in the first embodiment.

Accordingly, the plurality of LED packages 354 has the wide beam angle characteristics of 125 to 130 degrees, and thus the overlapping area of the lights exiting from the adjacent LED packages 354 can become considerably closer than in the existing LED packages. Therefore, it is possible to reduce the shielding area F of the light-incident portion of the LED packages 354, thereby allowing for a narrow-bezel.

Figure 5:
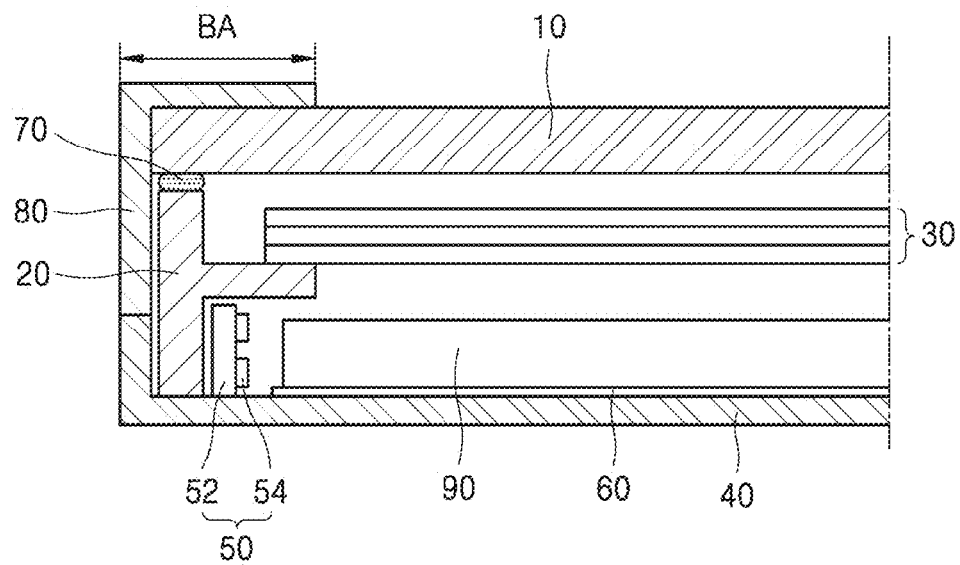
FIG. 5 is a cross-sectional view showing a part of another existing display device.
Figure 6:
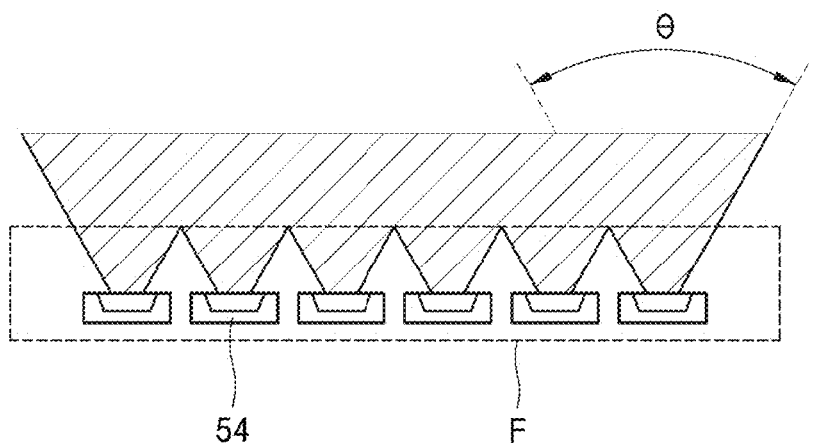
FIG. 6 is a view illustrating a beam angle characteristic of the existing LED package of FIG. 5.

For a screen size of 55 inches, the bezel BA of the existing display device 1 shown in FIG. 5 is designed to have a thickness of approximately 5.9 mm, as the LED packages 54 have the narrow beam angle characteristics. In contrast, the bezel BA of the display device 300 according to the third embodiment of the present disclosure can be designed to have a thickness of approximately 3.9 mm by introducing the LED packages 354 having the wide beam angle characteristic.

In this regard, as the distance between the plurality of LED packages 354 and the light guide plate 390 is reduced to implement the narrow bezel, if a pure white buffer pad is used, the lights exiting from the plurality of LED packages 354 may be fully reflected by the buffer pad 356, resulting in a light bouncing defect at the light-incident portion to degrade the image quality.

Therefore, according to an exemplary embodiment of the present disclosure, the buffer pad 356 has a milky color having optimum conditions for absorption and reflection to thereby overcome the light bouncing defect at the light-incident portion.

Specifically, the buffer pad 356 is preferably composed of 95% to 99% by weight of a base resin and 1% to 5% by weight of a milky pigment. As a result, the buffer pad 356 has a transparency of 50% to 90%.

If the amount of the added milky pigment is less than 1% by weight of the total weight of the buffer pad 356, it may be insufficient to exhibit the above effect. On the other hand, when the amount of the added milky pigment is greater than 5% by weight of the total weight of the buffer pad 356, light is overly absorbed such that the emission efficiency of the light exiting from the LED packages 354 may be lowered, which is undesirable.

The base resin may be made of, but is not limited to, at least one selected from the group consisting of polycarbonate (PC), polyimide resin (PI), polyethylene terephthalate (PET), and polyether sulfone (PES).

The milky pigment may be made of, but is not limited to, silsesquioxane.

According to the third embodiment of the present disclosure, the display device employs the milky buffer pad 356 having optimal conditions for absorption and reflection, and the LED package 354 having the wide beam angle characteristics of 125 to 130 degrees, and thus it is possible to implement the narrow bezel and to overcome the light bouncing at the light-incident portion due to the narrow bezel.

Although the exemplary embodiments of the present disclosure have been described for illustrative purposes, those skilled in the art will appreciate that various modifications, additions and substitutions are possible without departing from the scope and spirit of the present disclosure. Accordingly, it will be understood that such modifications, additions and substitutions also fall within the scope of the present disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. An LED package module, comprising:
    an LED module substrate; and
    a plurality of LED packages mounted on the LED module substrate, each of the plurality of LED packages having a long axis and a short axis,
    wherein each of the plurality of LED packages includes:
        at least one LED chip mounted on a substrate;
        a mold frame supporting the LED chip, the mold frame having two closed side surfaces in parallel with the long axis and two open side surfaces in parallel with the short axis; and
        an encapsulant sealing the substrate and the LED chip in the mold frame, the encapsulant being at least partially exposed along the two open side surfaces of the mold frame.

2. The LED package module of claim 1, wherein the plurality of LED packages comprises first LED packages mounted on the LED substrate with the open side surfaces aligned in a first direction, and second LED packages mounted on the LED substrate with the open side surfaces aligned in a second direction that intersects the first direction.

3. The LED package module of claim 2, wherein the first and second LED packages are arranged in a matrix of columns and rows, and are oriented in the intersecting first and second directions, respectively, alternately in each of the columns and rows.

4. The LED package module of claim 3, wherein each of the first and second LED packages has a beam angle of 125 to 130 degrees.

5. The LED package module of claim 4, wherein a center axis of a respective one of the first LED packages is spaced apart from a center axis of an adjacent second LED package in a same column by a first distance, and the center axis of the respective one of the first LED packages is spaced apart from a center axis of an adjacent second LED package in a same row by a second distance.

6. The LED package module of claim 5, wherein the first distance is within a range of 37 mm to 42 mm, and the second distance is within a range of 38 mm to 42 mm.

7. The LED package module of claim 1, wherein the plurality of LED packages are arranged in a plurality of diamond patterns, each of the plurality of diamond patterns including two first LED packages that are mounted on the LED substrate with the open side surfaces aligned in a first direction, and two second LED packages that are mounted on the LED substrate with the open side surfaces aligned in a second direction that intersects the first direction.

8. A display device, comprising:
    a display panel;
    a main support disposed under the display panel to support edges of the display panel;
    a plurality of optical sheets seated on the main support;
    a bottom cover mounted under the main support;
    an LED package module mounted on the bottom cover;
    a reflective plate mounted on the LED package module and having a plurality of through holes through which the LED package module at least partially protrudes; and
    a top case mounted on the display panel and coupled to the main support and the display panel,
    wherein the LED package module includes an LED module substrate and a plurality of LED packages mounted on the LED module substrate, each of the plurality of LED packages having a long axis and a short axis, and
    wherein each of the plurality of LED packages includes:
        at least one LED chip mounted on a substrate;
        a mold frame supporting the LED chip, the mold frame having two closed side surfaces in parallel with the long axis and two open side surfaces in parallel with the short axis; and
        an encapsulant sealing the substrate and the LED chip in the mold frame, the encapsulant being at least partially exposed along the two open side surfaces of the mold frame.

9. The display device of claim 8, wherein the plurality of LED packages includes first LED packages mounted on the LED substrate with the open side surfaces aligned in a first direction, and second LED packages mounted on the LED substrate with the open side surfaces aligned in a second direction that intersects the first direction.

10. The display device of claim 9, wherein the first and second LED packages are arranged in a matrix of columns and rows, each column and each row having an alternating arrangement of the first and second LED packages.

11. The display device of claim 10, wherein each of the first and second LED packages has a beam angle within a range of 125 degrees to 130 degrees.

12. The display device of claim 11, wherein a center axis of a respective one of the first LED packages is spaced apart from a center axis of an adjacent second LED package in a same column by a first distance, and the center axis of the respective one of the first LED packages is spaced apart from a center axis of an adjacent second LED package in a same row by a second distance.

13. The display device of claim 8, wherein the plurality of LED packages are arranged in a plurality of diamond patterns, each of the plurality of diamond patterns including two first LED packages that are mounted on the LED substrate with the open side surfaces aligned in a first direction, and two second LED packages that are mounted on the LED substrate with the open side surfaces aligned in a second direction that intersects the first direction.

14. A display device comprising:
    a display panel;
    a main support disposed under the display panel to support edges of the display panel;
    a plurality of optical sheets seated on the main support;
    a bottom cover mounted under the main support;
    an LED package module mounted on the bottom cover at a position adjacent to at least one edge of the bottom cover;
    a reflective plate mounted on the bottom cover;

a light guide plate mounted between the reflective plate and the optical sheets, the light guide plate having a side surface facing the LED package module; and a top case mounted on the display panel and coupled to the main support and the display panel, wherein the LED package module includes an LED module substrate and a plurality of LED packages mounted on the LED module substrate, each of the plurality of LED packages having a long axis and a short axis, and wherein each of the plurality of LED packages includes:
  at least one LED chip mounted on a substrate;
  a mold frame supporting the LED chip, the mold frame having two closed side surfaces in parallel with the long axis and two open side surfaces in parallel with the short axis; and
  an encapsulant sealing the substrate and the LED chip in the mold frame, the encapsulant being at least partially exposed along the two open side surfaces of the mold frame.

15. The display device of claim 14, wherein the LED package module further comprises at least one buffer pad mounted on the LED substrate, the at least one buffer pad extending farther toward the side surface of the light guide plate than the LED packages.

16. The display device of claim 15, wherein the at least one buffer pad extends at least partially between a pair of adjacent LED packages.

17. The display device of claim 15, wherein the at least one buffer pad has a milky color.

18. The display device of claim 17, wherein the buffer pad is composed of 95% to 99% by weight of a base resin and 1% to 5% by weight of a milky pigment.

19. The display device of claim 18, wherein the base resin includes at least one of: polycarbonate (PC), polyimide resin (PI), polyethylene terephthalate (PET), and polyether sulfone (PES), and wherein the milky pigment includes silsesquioxane.

20. The display device of claim 15, wherein the at least one buffer pad has a transmittance in a range of 50% to 90%.

* * * * *